United States Patent [19]

Preisler et al.

[11] Patent Number: 5,235,309
[45] Date of Patent: Aug. 10, 1993

[54] RESISTIVE CURRENT LIMITER

[75] Inventors: Eberhard Preisler; Joachim Bock, both of Erftstadt; Angelika Abeln, Weinheim; Helmut Dersch, Titisee-Neustadt, all of Fed. Rep. of Germany

[73] Assignee: Hoechst Aktiengesellschaft, Fed. Rep. of Germany

[21] Appl. No.: 893,272

[22] Filed: Jun. 4, 1992

[30] Foreign Application Priority Data

Jun. 18, 1991 [DE] Fed. Rep. of Germany ....... 4119984

[51] Int. Cl.⁵ .................. H01C 7/10; H01L 39/00
[52] U.S. Cl. ................................. 338/20; 338/32 S; 361/19; 505/1
[58] Field of Search ............. 338/32 S, 20; 361/19, 361/141; 505/1; 335/216, 299; 307/99, 131, 135

[56] References Cited

U.S. PATENT DOCUMENTS

| | | | |
|---|---|---|---|
| 3,703,664 | 11/1972 | Cronin | 307/99 X |
| 4,961,066 | 10/1990 | Bergsjö et al. | 338/32 S |
| 4,970,483 | 11/1990 | Wicker et al. | 505/1 X |
| 4,994,932 | 2/1991 | Okamoto et al. | 361/19 |
| 5,021,914 | 6/1991 | Tsurunaga et al. | 361/19 |
| 5,053,383 | 10/1991 | Short et al. | 505/1 |
| 5,083,232 | 1/1992 | Bergsjö et al. | 361/11 |

*Primary Examiner*—Marvin M. Lateef
*Attorney, Agent, or Firm*—Connolly & Hutz

[57] ABSTRACT

The invention relates to a resistive current limiter having at least one conductor of a superconductive high-temperature material, carrying the rated current. The electrically active length of said conductor is at least three times greater than its linear extent.

16 Claims, 3 Drawing Sheets

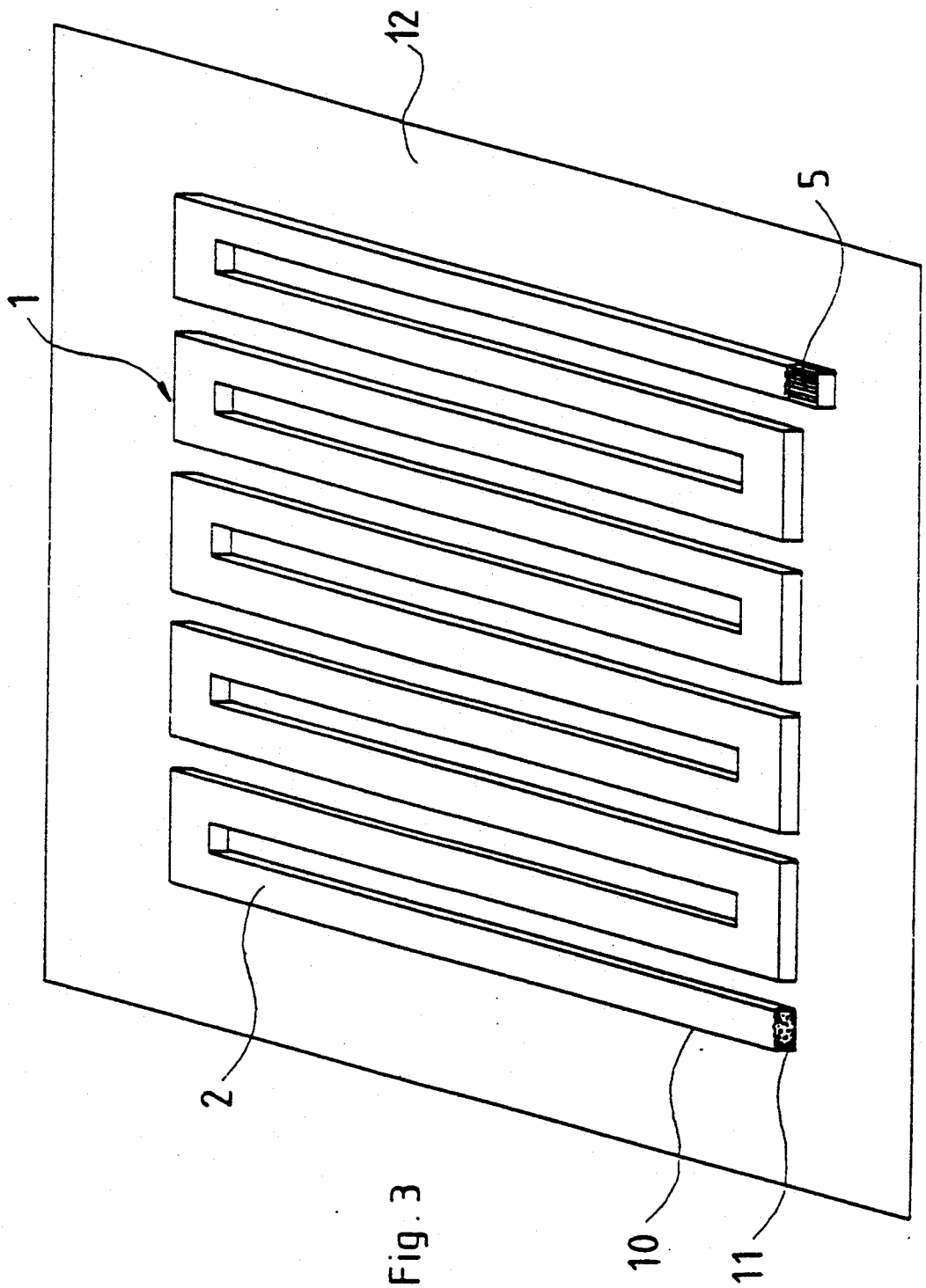

RESISTIVE CURRENT LIMITER

BACKGROUND OF THE INVENTION

The invention relates to a resistive current limiter having at least one conductor of superconductive high-temperature material carrying the rated current.

Current limiters of this type have been known for many years. They exhibit at least one conductor of superconductive material which is capable of carrying rated currents of many amperes. Because of the great change in resistance during the transition from the superconductive to the normally conductive state, current limiters of this type can be used for switching purposes in this range (compare the information bulletin "Theoretical and experimental investigations of the properties of a large superconductive direct-current limiter with a switching power of 40 MW at a voltage of 47 kV", Karlsruhe Nuclear Research Centre KfK 2672 (1978). Because of its disappearing electrical resistance, the superconductive material of the current limiter does not cause any resistive losses at all. Since this state occurs only below the critical temperature $T_c$, the critical current and the critical magnetic field, the superconductive material of a current limiter can be brought from the superconductive state to a resistive state by excessively increasing one of these parameters beyond the critical value. Such current limiters are capable of limiting currents to a residual current which can then be disconnected with the aid of a residual-current switch. Because of the relatively low electrical resistance of the superconductive material above the critical temperature $T_c$, a very long conductor, which must be accommodated with low inductance in the smallest possible volume, is required for optimum current-limiting.

SUMMARY OF THE INVENTION

The invention is based on the object of specifying a resistive current limiter which is suitable for limiting large and small currents and, moreover, is of small dimensions.

According to the invention, this object is achieved by the electrically active length of the conductor being at least three times greater than its linear extent.

The resistive current limiter according to the invention can optionally also be developed by a) the total length of the conductor, its cross-section and the vertical spacing of its conductor sections being selected in such a manner that, when the critical current density is exceeded, the resistance occurring in the superconductive material above its critical temperature $T_c$ exhibits a magnitude which results in a reduction in the current flowing, b) the conductor being fabricated from a superconductive plate having defined dimensions, c) the conductor being fabricated from a superconductive orthogonal plate which, for forming the conductor, is provided with slots which are cut at a defined distance, parallel, and alternating with one another, into the two sides extending with respect to the longitudinal axis of the plate, d) the conductor being formed by a groove which is filled with superconductive material and which is arranged in the form of a meander in the surface of a carrier, e) the conductor being formed by a sleeve, filled with superconductive material, which is adapted to the desired cross-section of the conductor by rolling and drawing and is arranged in the form of a meander, f) the superconductive high-temperature material used for fabricating the conductor being a polynary oxide which contains bismuth, calcium, strontium, copper and possibly lead, g) the conductor consisting of a superconductive high-temperature material in the form of a polynary oxide which contains yttrium and/or a rare-earth metal and barium and copper, h) the conductor consisting of $YBa_2Cu_3O_{5.9}$ or $Bi_2Sr_2CaCu_2O_8$ or $Bi_2Sr_2Ca_2Cu_3O_{10}$, i) the conductor consisting of NbTi, $Nb_3Sn$ or Chevrel phases.

The current-carrying conductor of the resistive current limiter is fabricated from a superconductive high-temperature material. A polynary oxide is preferably used as superconductive material. Yttrium-barium-copper oxide or bismuth cuprate are particularly suitable for this purpose, and the latter can contain lead additives. Ceramic materials having superconductive properties can also be used which contain a different or an additional rare-earth metal instead of yttrium. Similarly, NbTi, $Nb_3Sn$ or Chevrel phases can be considered for the fabrication.

Due to the special construction of the conductor, its electrically active length can be significantly increased whilst its linear extent does not exceed a predeterminable value. The electrically active length of the conductor, its cross-section and the vertical spacing of in each case two adjacent conductor sections are dimensioned in such a manner that, when the critical current density is exceeded, the resistance occurring in the superconductive material above the critical temperature $T_c$ exhibits a magnitude which results in a reduction to a defined value in the current flowing.

According to the invention, the conductor can be fabricated from a superconductive orthogonal plate. Cut into the sides extending parallel to the longitudinal axis of the plate are a defined number of slots which extend vertically with respect to the longitudinal axis of the plate. The slots are cut into these two longitudinal sides such that they alternate. This forms a meandering conductor from the plate. The ends of the conductor thus formed are provided with one electric connecting pole each.

It is also possible to form a meandering groove in the surface of a carrier. The dimensions of the groove are defined in accordance with the above information on the conductor. The carrier can be fabricated from a metallic or insulating material. In the case of a metallic carrier, the groove is first lined with an insulating material and then filled with the superconductive material.

In another illustrative embodiment of the current limiter according to the invention, the sleeve of metal, preferably of silver or copper, is filled with a superconductive metallic or ceramic material. The sleeve is then rolled and drawn so that its cross-section corresponds to that of the conductor to be formed. The sleeve is subsequently bent in a meandering shape so that a current limiter is produced, the conductor of which exhibits the required dimensions.

When a critical current intensity is exceeded, the resistive current limiter according to the invention loses its superconductive properties and becomes a resistor. Because of the specially selected dimensions of its electrically active length, however, it returns to the superconductive state as soon as the supercritical current no longer flows through it.

BRIEF DESCRIPTION OF THE DRAWINGS

In the text which follows, the invention will be explained in greater detail with reference to drawings, in which:

FIG. 3 shows a third embodiment of the resistive current limiter according to the invention.

DETAILED DESCRIPTION OF THE INVENTION

Figure 1:
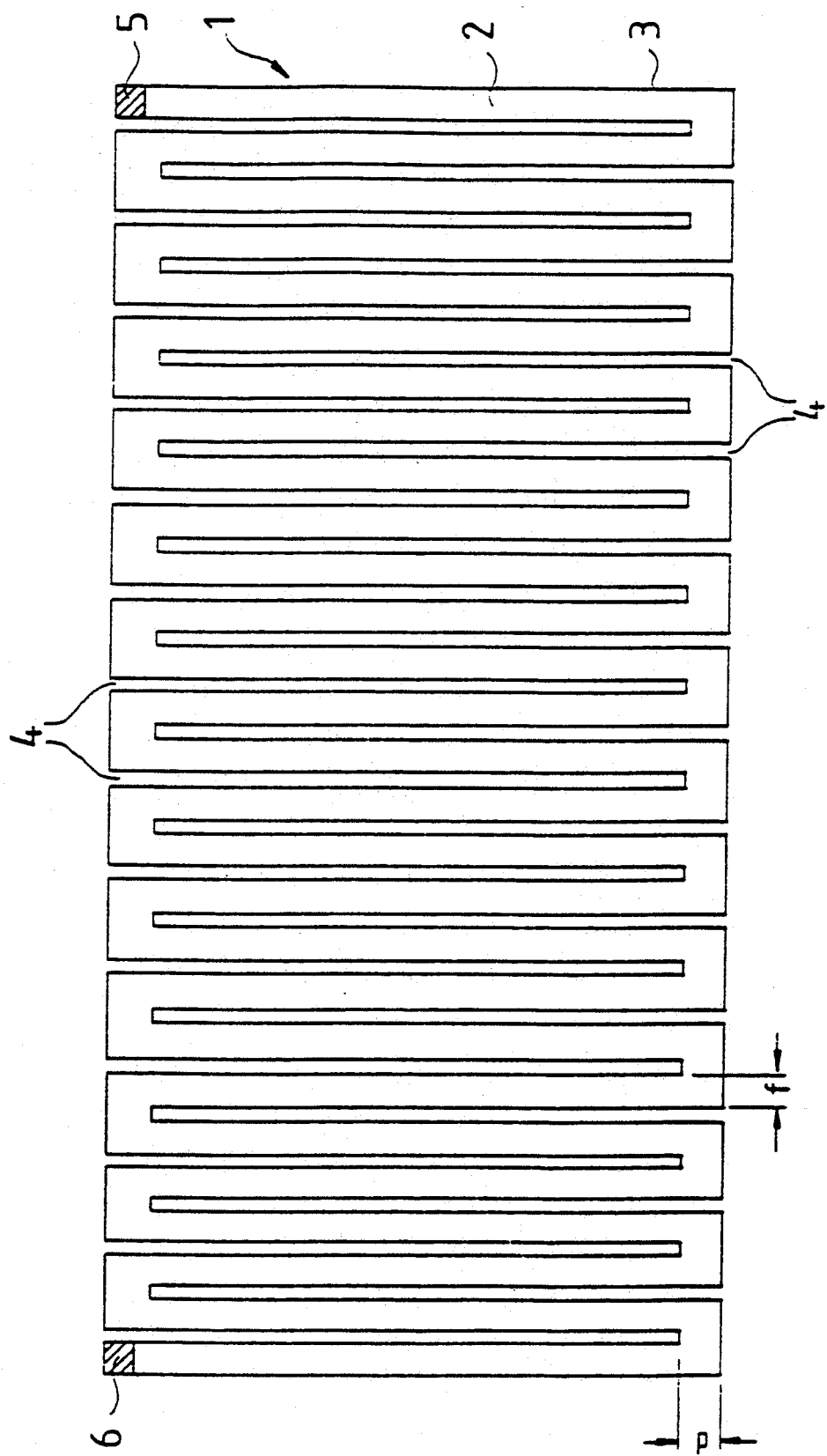
FIG. 1 shows a resistive current limiter fabricated from a superconductive plate.

The resistive current limiter 1 shown in FIG. 1 exhibits a conductor 2 having superconductive properties. The conductor 2 is fabricated from a superconductive plate which is of orthogonal shape in the example shown here. The plate 3 is fabricated from $YBa_2Cu_3O_{5.9}$. It is pressed at a pressure of 7 kbar. The plate 3 is then sintered for about 24 hours at 950° C. This is followed by cooling of the plate material from 900° to 400° C. over 48 hours. The plate 3 has a size of $85 \times 50 \times 5$ mm$^3$. It has a density of 4.69 g cm$^{-3}$. This corresponds to a theoretical density of 74%. The critical temperature of this plate 3 is about 89K (R=0 ohms). The slots 4 are sawn into the longitudinal sides of the plate 3. The slots 4 are arranged in an alternating manner and at right angles to the longitudinal axis of the plate 3. The slots are sawn into the plate 3 to such an extent that the distance d from the slot end to the immediately adjacent longitudinal side of the plate 3 is approximately as large as the distance f between two adjacent slots 4. In this arrangement, this is about 2 mm. This forms a meandering conductor 2. The conductor 2 is provided with an electric connecting pole (5, 6) at each of its two ends.

If, for reasons of electrical conductivity of the superconductive material, it is necessary to use a plate 3 which is not self-supporting, said plate is permanently joined to a carrier (not shown here) to increase its stability. This carrier can be fabricated from an insulating material or from a metallic material. When a metallic material is used, an insulating material (not shown here) is arranged between the plate 3 and the carrier (not shown here). After the plate 3 is bonded to such a carrier, the slots 4 are formed as described above. In the example shown here, the slots 4 having a length of 4.2 cm and a width of 1 mm are sawn into the plate 3. The distance between two adjacent slots 4 is 2 mm. The conductor 2 formed by this method has a total length of 169 cm and satisfies the desired condition of current limiting in the required manner.

The same plate 3, if it is provided with only twelve slots of the same length, produces a conductor having a length of 67.7 cm. The resistance of such a conductor is 0.70 ohms at room temperature. At 77K and a critical current density of 87 A cm$^2$, the superconductivity is interrupted at a current intensity of about 25 A.

Figure 2:
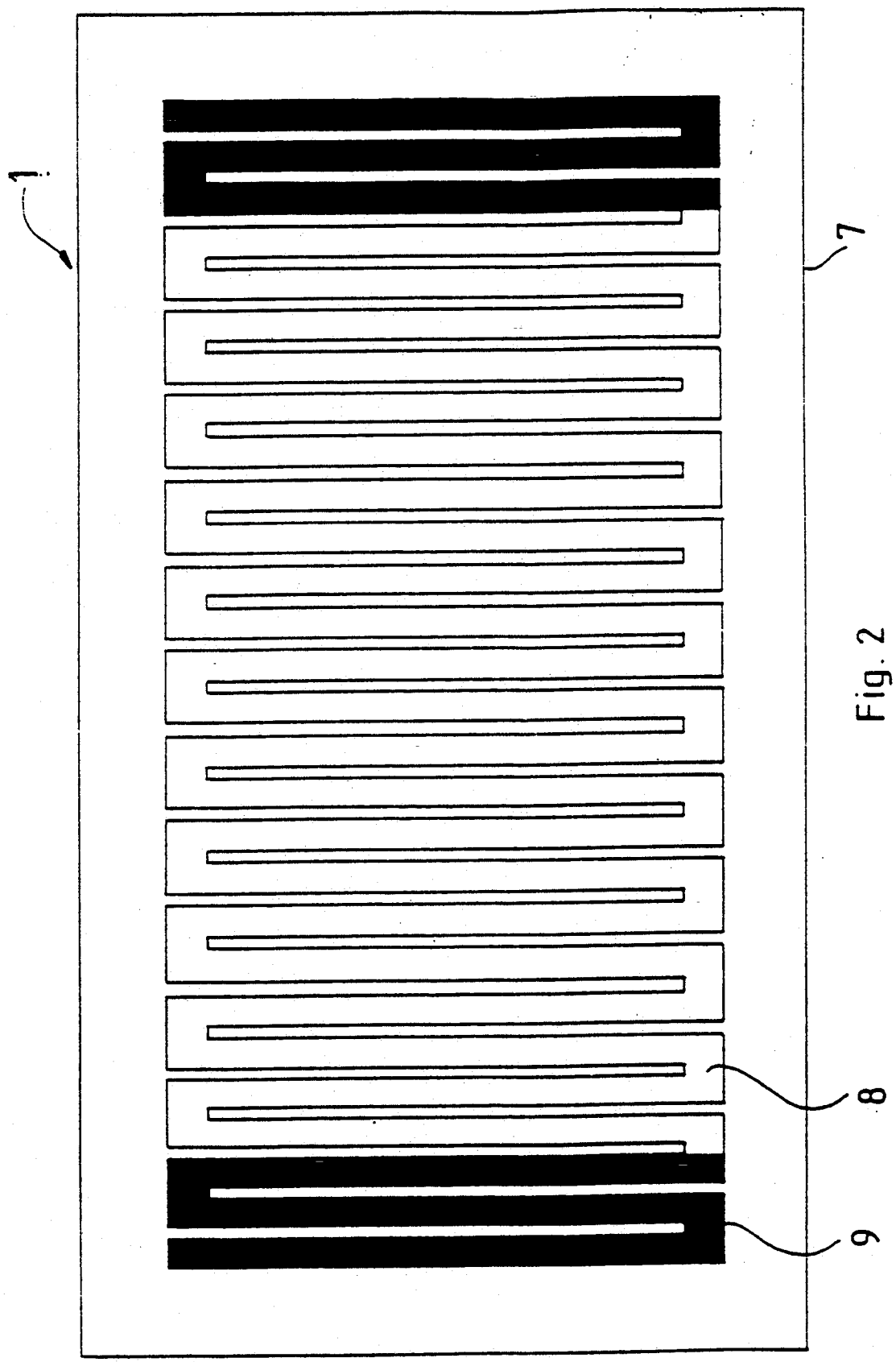
FIG. 2 shows another embodiment of the resistive current limiter according to the invention.

FIG. 2 shows another embodiment of the current limiter 1 according to the invention. In this arrangement, this current limiter is formed by a carrier 7, in the surface of which a meandering groove is formed. This is filled with superconductive material 9 to form the conductor 2. So that the conductor 2 formed by this slot has the same properties as the conductor 2, shown in FIG. 1 and explained in the associated description, the groove 8 has the same dimensions as the conductor 2 according to FIG. 1. If the carrier 7 is fabricated from an electrically conductive material, the groove 8 is first lined with an insulating material (not shown here).

If the carrier 7 is fabricated from an insulating material, the groove 8 can be directly filled with the original material which later exhibits superconductive properties. This material 9 receives its superconductive properties by means of a corresponding subsequent treatment.

As is shown in FIG. 3, the conductor 2 of the current limiter 1 can also be formed from a sleeve 10 which is filled with superconductive material 11. The sleeve 10 is rolled and drawn in such a manner that the conductor 2 has the same cross-section as the conductor 2 shown in FIG. 1. The sleeve 10 is additionally bent in such a manner that the conductor 2 exhibits the required meandering shape. The conductor 2 exhibits has an electrical connecting pole 5 at its end. If it is required, the sleeve 10 used as the conductor 2 can be mounted on a carrier 12 in order to improve the mechanical stability of the current limiter 1.

We claim:

1. A resistive current limiter having at least one conductor of a superconductive high-temperature material for carrying a rated current, said conductor exhibiting an electrically active length, a total length, a linear extent, a cross-section and conducting sections being vertically spaced from one another, which comprises, said electrically active length being at least three times greater than the linear extent; said conductor being fabricated from a superconductive plate having defined dimensions, being provided with slots cut at a defined distance, parallel to and alternating with one another, into the two sides extending with respect to the longitudinal axis of the plate; and the total length of the conductor, its cross-section and the conducting sections being selected in such a manner that, if a critical current density being exceeded, the resistance occurring in the superconductive material above its critical temperature $T_c$ exhibiting a magnitude resulting in a reduction in the current flowing.

2. The resistive current limiter as claimed in claim 1, wherein the conductor is fabricated from a superconductive orthogonal plate.

3. The resistive current limiter as claimed in claim 1, wherein the conductor consists of a polynary oxide having been selected from the group consisting of $Bi_2Sr_2CaCu_2O_8$ and $Bi_2Sr_2Ca_2Cu_3O_{10}$.

4. The resistive current limiter as claimed in claim 1 wherein the superconductive high-temperature material used for fabricating the conductor is a polynary oxide which contains bismuth, calcium, strontium and copper.

5. The resistive current limiter as claimed in claim 4, wherein the polynary oxide contains lead additionally.

6. The resistive current limiter as claimed in claim 1, wherein the conductor has been selected from the group consisting of NbTi, $NB_3Sn$ and Chevrel phases.

7. A resistive current limiter having at least one conductor of a superconductive high-temperature material for carrying a rated current, said conductor exhibiting an electrically active length, a total length, a linear extent, a cross-section and conducting sections being vertically spaced from one another, which comprises, said electrically active length being at least three times greater than the linear extent; said conductor being formed by a groove being filled with superconductive material and being arranged in the form of a meander in the surface of a carrier; and the total length of the conductor, its cross-section and the conducting sections being selected in such a manner that, if a critical current density being exceeded, the resistance occurring in the superconductive material above its critical temperature $T_c$ exhibiting a magnitude resulting in a reduction in the current flowing.

8. The resistive current limiter as claimed in claim 7, wherein the superconductive high-temperature material used for fabricating the conductor is a polynary oxide which contains bismuth, calcium, strontium and copper.

9. The resistive current limiter as claimed in claim 8, wherein the polynary oxide contains lead additionally.

10. The resistive current limiter as claimed in claim 7, wherein the conductor consists of a polynary oxide having been selected from the group consisting of $Bi_2Sr_2CaCu_2O_8$ and $Bi_2Sr_2Ca_2Cu_3O_{10}$.

11. The resistive current limiter as claimed in claim 7, wherein the conductor has been selected from the group consisting of NbTi, $Nb_3Sn$ and Chevrel phases.

12. The resistive current limiter having at least one conductor of a superconductive high-temperature material for carrying a rated current, said conductor exhibiting an electrically active length, a total length, a linear extent, a cross-section and conducting sections being vertically spaced from one another, which comprises, said electrically active length being at least three times greater than the linear extent; said conductor being formed by a sleeve, filled with superconductive material, being adapted to the desired cross-section of the conductor by rolling and drawing and being arranged to be meander-shaped; and the total length of the conductor, its cross-section and the conducting sections being selected in such a manner that, if a critical current density being exceeded, the resistance occurring in the superconductive material above its critical temperature $T_c$ exhibiting a magnitude resulting in a reduction in the current flowing.

13. The resistive current limiter as claimed in claim 12, wherein the superconductive high-temperature material used for fabricating the conductor is a polynary oxide which contains bismuth, calcium, strontium and copper.

14. The resistive current limiter as claimed in claim 13, wherein the polynary oxide contains lead additionally.

15. The resistive current limiter as claimed in claim 12, wherein the conductor consists of a polynary oxide having been selected from the group consisting of $Bi_2Sr_2CaCu_2O_8$ and $Bi_2Sr_2Ca_2Cu_3O_{10}$.

16. The resistive current limiter as claimed in claim 12, wherein the conductor has been selected from the group consisting of NbTi, $Nb_3Sn$ and Chevrel phases.

* * * * *

UNITED STATES PATENT AND TRADEMARK OFFICE
CERTIFICATE OF CORRECTION

PATENT NO. : 5,235,309
DATED : August 10, 1993
INVENTOR(S) : EBERHARD PREISLER ET AL It is certified that error appears in the above-indentified patent and that said Letters Patent is hereby corrected as shown below:

Column 4, line 59 (claim 6, line 3), "$NB_3Sn$" should read -- $Nb_3Sn$ --.

Signed and Sealed this

Twenty-fourth Day of May, 1994

Attest:

BRUCE LEHMAN

Attesting Officer        Commissioner of Patents and Trademarks